(12) United States Patent
Matsushita

(10) Patent No.: US 8,119,024 B1
(45) Date of Patent: Feb. 21, 2012

(54) PIEZOELECTRIC SINGLE CRYSTAL INGOT, PRODUCING METHOD THEREFOR AND PIEZOELECTRIC SINGLE CRYSTAL DEVICE

(75) Inventor: Mitsuyoshi Matsushita, Tokyo (JP)

(73) Assignee: JFE Mineral Company, Ltd. (JP)

( * ) Notice: Subject to any disclaimer, the term of this patent is extended or adjusted under 35 U.S.C. 154(b) by 0 days.

(21) Appl. No.: 12/858,501

(22) Filed: Aug. 18, 2010

(51) Int. Cl.
*C04B 35/00* (2006.01)
*H01L 41/00* (2006.01)
*C30B 9/00* (2006.01)

(52) U.S. Cl. .............. 252/62.9 PZ; 310/358; 117/81

(58) Field of Classification Search ........... 252/62.9 PZ, 252/62.9 R; 117/948, 949, 81; 423/594.8, 423/598; 310/358
See application file for complete search history.

(56) References Cited

U.S. PATENT DOCUMENTS

| | | | |
|---|---|---|---|
| 6,798,717 B2 * | 9/2004 | Wiener-Avnear et al. | 367/180 |
| 7,402,938 B2 * | 7/2008 | Matsushita et al. | 310/358 |
| 7,759,845 B2 * | 7/2010 | Fukui et al. | 310/358 |
| 2007/0034141 A1 * | 2/2007 | Han | 117/81 |
| 2007/0267947 A1 * | 11/2007 | Matsushita et al. | 310/358 |

FOREIGN PATENT DOCUMENTS

JP  2009280413 A  * 12/2009

* cited by examiner

*Primary Examiner* — Jerry Lorengo
*Assistant Examiner* — Lynne Edmondson
(74) *Attorney, Agent, or Firm* — DLA Piper LLP (US)

(57) ABSTRACT

A piezoelectric single crystal ingot is produced by the Bridgman method and contains a relaxor having a composition of $Pb(Mg, Nb)O_3$ and lead titanate having a composition of $PbTiO_3$. In the piezoelectric single crystal ingot, the compositional fraction of lead titanate does not vary monotonically in the growth direction of a single crystal and the variation of the compositional fraction thereof is within the range of ±2.0 mole percent over a length of 30 mm or more. A piezoelectric single crystal device is produced from the piezoelectric single crystal ingot.

16 Claims, 3 Drawing Sheets

PIEZOELECTRIC SINGLE CRYSTAL INGOT, PRODUCING METHOD THEREFOR AND PIEZOELECTRIC SINGLE CRYSTAL DEVICE

TECHNICAL FIELD

This disclosure relates to a piezoelectric single crystal ingot, a method for producing the piezoelectric single crystal ingot, and a piezoelectric single crystal device. The disclosure particularly relates to a piezoelectric single crystal ingot in which the variation of the compositional fraction of lead titanate is suppressed, a method for producing the piezoelectric single crystal ingot, and a piezoelectric single crystal device which can be produced from the piezoelectric single crystal ingot at low cost and which has uniform piezoelectric properties.

BACKGROUND

A known example of a practical piezoelectric material is lead zirconate titanate ($PbZr_xTi_{(1-x)}O_3$, (wherein x≈0.5)), which is a solid solution of lead zirconate ($PbZrO_3$) and lead titanate ($PbTiO_3$).

Lead zirconate titanate cannot be obtained in the form of a single crystal having a size, for example, a cross-sectional area of 1 cm$^2$, suitable for practical use and therefore is used in the form of a sintered body which is a cluster of fine crystals. Therefore, there is a problem in that only an isotropic property that is the average of piezoelectric properties of the fine crystals, which form the sintered body, in orientations can be used because a crystal orientation exhibiting excellent piezoelectric properties of a single crystal of lead zirconate titanate cannot be selectively used.

A complete solid solution type piezoelectric single crystal (relaxor-lead titanium solid solution) that contains a relaxor having the composition $Pb(A_1, A_2, \ldots, B_1, B_2, \ldots)O_3$ and lead titanate, which has the composition $PbTiO_3$, and that has a complex perovskite structure can be grown to a size sufficient to obtain a tabular piezoelectric single crystal device having a size, for example, a cross-sectional area of 1 cm$^2$ or more, suitable for practical use. Therefore, a piezoelectric device having a practical size can be manufactured such that a crystal orientation exhibiting excellent piezoelectric properties of a material is selected depending on applications.

An example of the complete solid solution type piezoelectric single crystal, which contains a relaxor having the composition $Pb(A_1, A_2, \ldots, B_1, B_2, \ldots)O_3$ and lead titanate, which has the composition $PbTiO_3$, is a lead magnesium niobate ($Pb(Mg, Nb)O_3$)-lead titanate ($PbTiO_3$) solid solution (hereinafter simply referred to as PMN-PT or PMNT).

The piezoelectric single crystal can be grown by the Bridgman method or Czochralski method, in which a single crystal is grown from a source melt; a flux method in which crystals are precipitated from a source solution; a top seeded solution growth (TSSG) method which is a type of flux method; or another method.

In the case of growing the piezoelectric single crystal by using the above methods, after a crystal source such as a powder mixture of the relaxor and lead titanate or a polycrystalline sintered pellet of a relaxor-lead titanate solid solution is put in a crucible and then melted or dissolved in a solvent, the resulting crystal source is gradually solidified in one direction using a seed crystal or the seed crystal is pulled out of the resulting crystal source, whereby the piezoelectric single crystal is desirably grown. The piezoelectric single crystal grown as described above is in the form of an ingot. The unprocessed piezoelectric single crystal is hereinafter referred to as a piezoelectric single crystal ingot.

In the case of producing the piezoelectric single crystal ingot by one of the above methods, there is a problem in that the compositional fraction (mole percent) of lead titanate varies monotonically in the growth direction of a single crystal. In the case of growing, for example, the PMN-PT, the compositional fraction of lead titanate in the piezoelectric single crystal ingot increases monotonically in the growth direction of the single crystal.

A piezoelectric single crystal device manufactured from the piezoelectric single crystal ingot is known to have piezoelectric properties, such as a Curie temperature (Tc), a dielectric constant (∈), an electromechanical coupling coefficient (k), and a piezoelectric constant (d), variable depending on the concentration of lead titanate in the piezoelectric single crystal device.

A portion of the piezoelectric single crystal ingot has a lead titanate concentration unsuitable for practically useful piezoelectric properties and heat resistance because of the variation of the compositional fraction of lead titanate. This causes a reduction in yield.

It could therefore be helpful to provide a complete solid solution type piezoelectric single crystal ingot in which the compositional fraction of lead titanate is inhibited from varying in the growth direction thereof, to provide a process for producing the complete solid solution type piezoelectric single crystal ingot, and to provide a piezoelectric single crystal device which can be manufactured from the complete solid solution type piezoelectric single crystal ingot at low cost and which has uniform piezoelectric properties.

SUMMARY

I discovered that the melt has a segregation coefficient keff different from 1 and therefore the compositional fraction of lead titanate varies monotonically in the course of the precipitation of the single crystal from the melt. In the case of growing the piezoelectric single crystal ingot, the percentage of lead titanate increases or decreases when the segregation coefficient keff is less than 1 (PMN-PT or the like) or greater than 1 (PZN-PT or the like), respectively.

I also discovered that a piezoelectric single crystal device having uniform piezoelectric properties can be manufactured at low cost in such a manner that a source of the relaxor, which has the composition $Pb(Mg, Nb)O_3$, is continuously supplied to a growth crucible in accordance with the segregation coefficient keff of lead titanate with respect to the relaxor in the course of producing the piezoelectric single crystal ingot by the Bridgman method such that the compositional fraction of lead titanate does not vary monotonically in the growth direction of the single crystal and the variation of the compositional fraction of lead titanate is within the range of ±2.0 mole percent over a length of 30 mm or more.

I thus provide:
(1) A piezoelectric single crystal ingot produced by the Bridgman method contains at least a relaxor having a composition of $Pb(Mg, Nb)O_3$ and lead titanate having a composition of $PbTiO_3$. The compositional fraction of lead titanate in the piezoelectric single crystal ingot does not vary monotonically in the growth direction of a single crystal and the variation of the compositional fraction thereof is within the range of ±2.0 mole percent over a length of 30 mm or more.

(2) The piezoelectric single crystal ingot according to Item (1), wherein the piezoelectric single crystal ingot is a complete solid solution type piezoelectric single crystal ingot.

(3) The piezoelectric single crystal ingot according to Item (1), wherein the piezoelectric single crystal ingot has a complex perovskite structure.

(4) The piezoelectric single crystal ingot according to Item (1), wherein the piezoelectric single crystal ingot further contains 0.5 mass ppm to 5 mass percent of at least one selected from the group consisting of Cr, Mn, Fe, Co, Al, Li, Ca, Sr, Ba, and Zr in total on the basis that 1 mol of Pb is 100 mass percent.

(5) The piezoelectric single crystal ingot according to Item (4), wherein the piezoelectric single crystal ingot contains 0.5 mass ppm to 5 mass percent of at least one selected from the group consisting of Cr, Mn, Fe, and Co in total on the basis that 1 mol of Pb is 100 mass percent.

(6) The piezoelectric single crystal ingot according to in Item (4), wherein the piezoelectric single crystal ingot contains 0.5 mass ppm to 5 mass percent of at least one selected from the group consisting of Ca, Sr, and Ba in total on the basis that 1 mol of Pb is 100 mass percent.

(7) The piezoelectric single crystal ingot according to Item (4), wherein the piezoelectric single crystal ingot contains 0.5 mass ppm to 5 mass percent of at least one of Al and Li in total on the basis that 1 mol of Pb is 100 mass percent.

(8) The piezoelectric single crystal ingot according to Item (1), wherein the piezoelectric single crystal ingot contains lead magnesium niobate having a composition of $Pb(Mg_{1/3}Nb_{2/3})O_3$, and lead titanate having the composition of $PbTiO_3$.

(9) A piezoelectric single crystal device is manufactured from the piezoelectric single crystal ingot according to Item (1).

(10) A method for producing a piezoelectric single crystal ingot containing at least a relaxor having a composition of $Pb(Mg, Nb)O_3$ and lead titanate having a composition of $PbTiO_3$, by using the Bridgman method, the method comprising:

continuously feeding a source of the relaxor to a growth crucible such that the compositional fraction of lead titanate does not vary monotonically in the growth direction of a single crystal and the variation of the compositional fraction thereof is within the range of ±2.0 mole percent over a length of 30 mm or more.

(11) The method according to Item (10), further comprising:

supplying relaxor source in such a manner that pellets obtained by sintering the relaxor source are quantitatively fed to the growth crucible at predetermined time intervals.

The following can thus be provided: a complete solid solution type piezoelectric single crystal ingot in which the compositional fraction of lead titanate is inhibited from varying in the growth direction of a single crystal, a process for producing the complete solid solution type piezoelectric single crystal ingot, and a piezoelectric single crystal device which can be manufactured from the complete solid solution type piezoelectric single crystal ingot at low cost and which has uniform piezoelectric properties.

DETAILED DESCRIPTION

The reason for specifying a piezoelectric single crystal device is described below.

A complete solid solution type piezoelectric single crystal ingot 1 is one, produced by the Bridgman method, containing a relaxor having the composition $Pb(Mg, Nb)O_3$ and lead titanate, which has the composition $PbTiO_3$.

The term "relaxor" as used herein refers to a material which has unique dielectric properties (the frequency at which the dielectric constant peaks and the peak dielectric constant depend on the temperature of a sample and the peak is broader as compared to barium titanate ($BaTiO_3$)) and which has the composition $Pb(Mg, Nb)O_3$ as described above. Lead titanate is a compound consisting of lead, titanium, and oxygen; has a perovskite structure at room temperature; is spontaneously polarized because of the large anisotropy thereof; and exhibits a large dielectric constant. The term "complete solid solution type crystal" as used herein refers to a crystal containing plural materials which are completely dispersed in each other in a liquid state and which form a homogeneous solid solution in a solid state.

Figure 1:
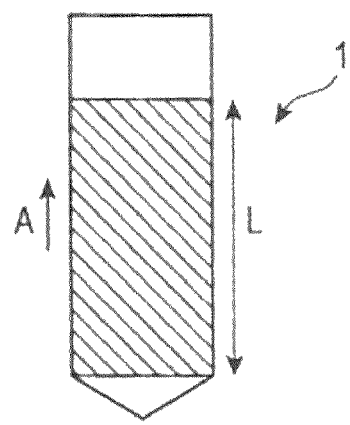
FIG. 1 is a schematic side view of a complete solid solution type piezoelectric single crystal ingot.

FIG. 1 is a schematic side view of the complete solid solution type piezoelectric single crystal ingot 1.

With reference to FIG. 1, the complete solid solution type piezoelectric single crystal ingot 1 is characterized in that the compositional fraction (mole percent) of lead titanate does not vary monotonically in the growth direction A of a single crystal and the variation of the compositional fraction of lead titanate is within the range of ±2.0 mole percent over a length L (see a hatched area shown in FIG. 1) of 30 mm or more.

If the complete solid solution type piezoelectric single crystal ingot 1 is obtained such that the variation of the compositional fraction of lead titanate is suppressed, the complete solid solution type piezoelectric single crystal ingot 1 has a large portion in which piezoelectric properties hardly vary and which can be used as a device. This leads to an increase in yield. The reason for limiting the variation of the compositional fraction of lead titanate within the range of ±2.0 mole percent is that if the variation of the compositional fraction of lead titanate exceeds 2.0 mole percent, a device manufactured from the complete solid solution type piezoelectric single crystal ingot 1 possibly has large differences in piezoelectric properties and therefore no uniform properties can be obtained.

Figure 2:
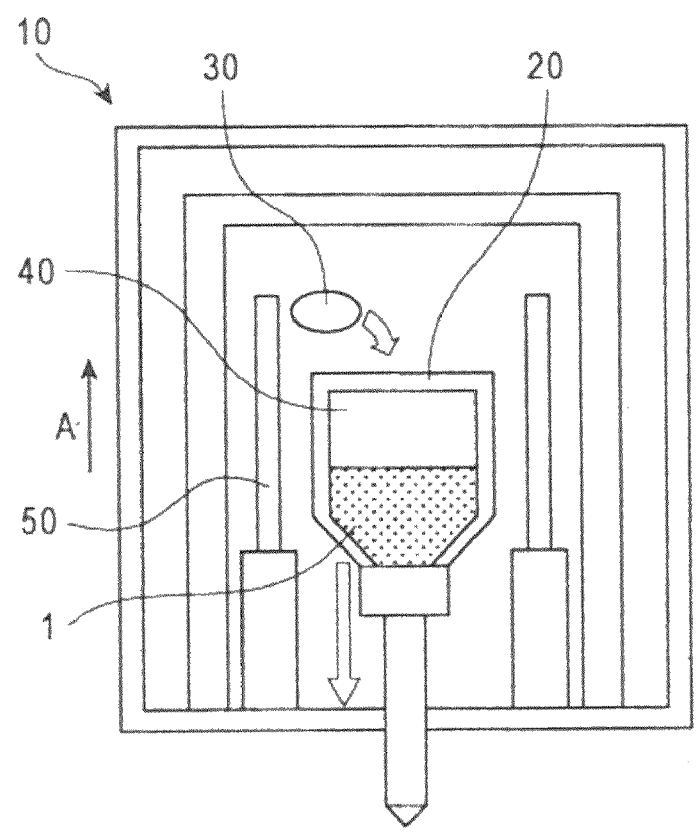
FIG. 2 is a schematic side sectional view of a system used in a melt Bridgman method.

An example of a process for producing the complete solid solution type piezoelectric single crystal ingot 1, which contains the relaxor having the composition $Pb(Mg, Nb)O_3$ and lead titanate having the composition $PbTiO_3$, is the Bridgman method as shown in FIG. 2. In the process, a source 30 of the relaxor is continuously supplied to a growth crucible 20 in consideration of the segregation coefficient of lead titanate with respect to the relaxor such that the compositional fraction of lead titanate does not vary monotonically in the growth direction of a single crystal and the variation of the compositional fraction of lead titanate is within the range of ±2.0 mole percent over a length of 30 mm or more.

The Bridgman method is as follows: after the source 30 in the growth crucible 20 is melted into a melt 40 in such a manner that the source 30 is heated to a temperature not lower than the melting point of the source 30 using a heater 50 or the like as shown in FIG. 2, the melt 40 is solidified in one direction (a direction A in FIG. 2).

A technique for supplying the source 30 in accordance with the segregation coefficient of lead titanate with respect to the relaxor is described below.

The segregation coefficient (keff) is a material constant defining the percentage of lead titanate in a relaxor-lead titanate solid solution single crystal precipitated from the melt 40. When the segregation coefficient (keff) is different from 1, the segregation of the solid solution single crystal proceeds. Since the segregation coefficient (keff) of PMN-PT is less than 1, the percentage of lead titanate increases in the growth direction of the single crystal.

The source 30 is added to the melt 40 in the growth crucible 20, whereby the loss of the relaxor due to segregation is compensated. This allows the variation of the compositional fraction (mole percent) of lead titanate in the complete solid solution type piezoelectric single crystal ingot 1 to be maintained constant (within the range of ±2.0 mole percent) over a length of 30 mm or more.

The technique for supplying the source 30 is not particularly limited and may be as follows: sintered pellets having an adjusted composition are quantitatively withdrawn at constant time intervals and then charged into the growth crucible 20.

Figure 3:
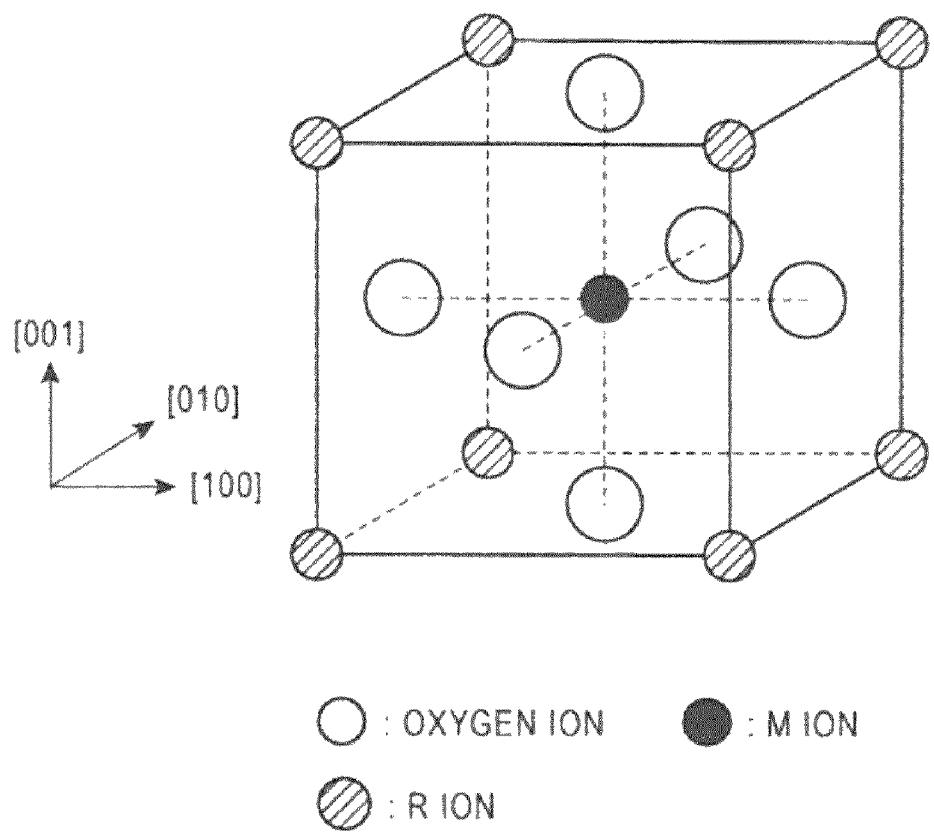
FIG. 3 is a schematic perspective view of a perovskite structure ($RMO_3$)

A target crystal structure is preferably a perovskite structure ($RMO_3$) in which R ions (for example, Pb ions) are located at the corners of a unit cell, oxygen ions are located at the face centers of the unit cell, an M ion is located at the body center of the unit cell as shown in FIG. 3, which shows the unit cell of a solid solution single crystal, and is more preferably a complex perovskite structure in which the M ion, which is located at the body center shown in FIG. 3, is not an ion of a single element but is any one of ions ($A_1, A_2, \ldots, B_1, B_2, \ldots$) of two or more types of elements. This is because a piezoelectric single crystal device suitable for a longitudinal vibrational mode can be obtained.

When the piezoelectric single crystal device needs to have a large dielectric constant $\in_r$ and/or a large mechanical quality factor $Q_m$, the complete solid solution type piezoelectric single crystal ingot 1 preferably further contains 0.5 mass ppm to 5 mass percent of one or more selected from the group consisting of Cr, Mn, Fe, Co, Al, Li, Ca, Sr, Ba, and Zr in total on the basis that 1 mol of Pb is 100 mass percent. When the content of one or more selected from these elements is less than 0.5 mass ppm, effects due to one or more selected from these elements are not remarkable. When the content thereof is greater than 5 mass percent, it is difficult for the complete solid solution type piezoelectric single crystal ingot 1 to maintain single crystallinity and the complete solid solution type piezoelectric single crystal ingot 1 is possibly transformed into a polycrystalline ingot. The use of, for example, Mn, Cr, Fe, or Co is effective in increasing the mechanical quality factor $Q_m$ and effective in preventing the mechanical quality factor $Q_m$ from being deteriorated with time. The use of Ca, Sr, or Ba is effective in increasing the dielectric constant $\in_r$. Al and Li contribute to prevent the formation of a polycrystalline region during the growth of a single crystal. The use of Ca is effective in preventing the formation of a pyrochlore phase during the growth of a single crystal.

The piezoelectric single crystal device can be manufactured from the complete solid solution type piezoelectric single crystal ingot 1. In the complete solid solution type piezoelectric single crystal ingot 1, the variation of the compositional fraction of lead titanate is held low (within the range of ±2.0 mole percent) over a certain length (30 mm or more). Therefore, a large number of piezoelectric single crystal devices can be obtained from the complete solid solution type piezoelectric single crystal ingot 1. This leads to a great increase in yield.

A particular process for manufacturing the piezoelectric single crystal device may include, for example, steps below:

(i) After the crystallographic orientation of the complete solid solution type piezoelectric single crystal ingot 1 is determined by, for example, the Laue method, the complete solid solution type piezoelectric single crystal ingot 1 is roughly sliced and an obtained slice is chemically etched with an etching solution as required, whereby a desired wafer is obtained. After the obtained wafer is ground with a grinder such as a lapping machine or a polishing machine or polished with a sander so as to have a desired thickness, a piezoelectric single crystal device material is prepared by cutting the resulting wafer using a precision cutter such as a dicing saw or a cutting saw.

(ii) Electrodes are provided on the upper surface and lower surface of the piezoelectric single crystal device material and piezoelectricity is imparted to the piezoelectric single crystal device material by polarization, whereby the piezoelectric single crystal device is manufactured.

The above structures are for exemplification only. Various modifications can be made within the scope of this disclosure.

EXAMPLES

The preparation and evaluation of a complete solid solution type piezoelectric single crystal ingot are described below.

Example 1 and Comparative Example 1

In Example 1 and Comparative Example 1, a melt material 40 used was a solid solution single crystal (PMN-PT), containing 68 mole percent lead magnesoniobate (PMN) and 32 mole percent lead titanate (PT), having the composition $Pb[(Mg, Nb)_{0.68}Ti_{0.32}]O_3$.

In Example 1, a sample of a complete solid solution type piezoelectric single crystal ingot 1 was prepared by a melt Bridgman method using a system 10 shown in FIG. 2 in such a manner that a source of a relaxor was continuously supplied to a growth crucible 20.

In Comparative Example 1, a sample of a complete solid solution type piezoelectric single crystal ingot 1 was prepared by a conventional melt Bridgman method using the system 10 shown in FIG. 2.

Figure 4:
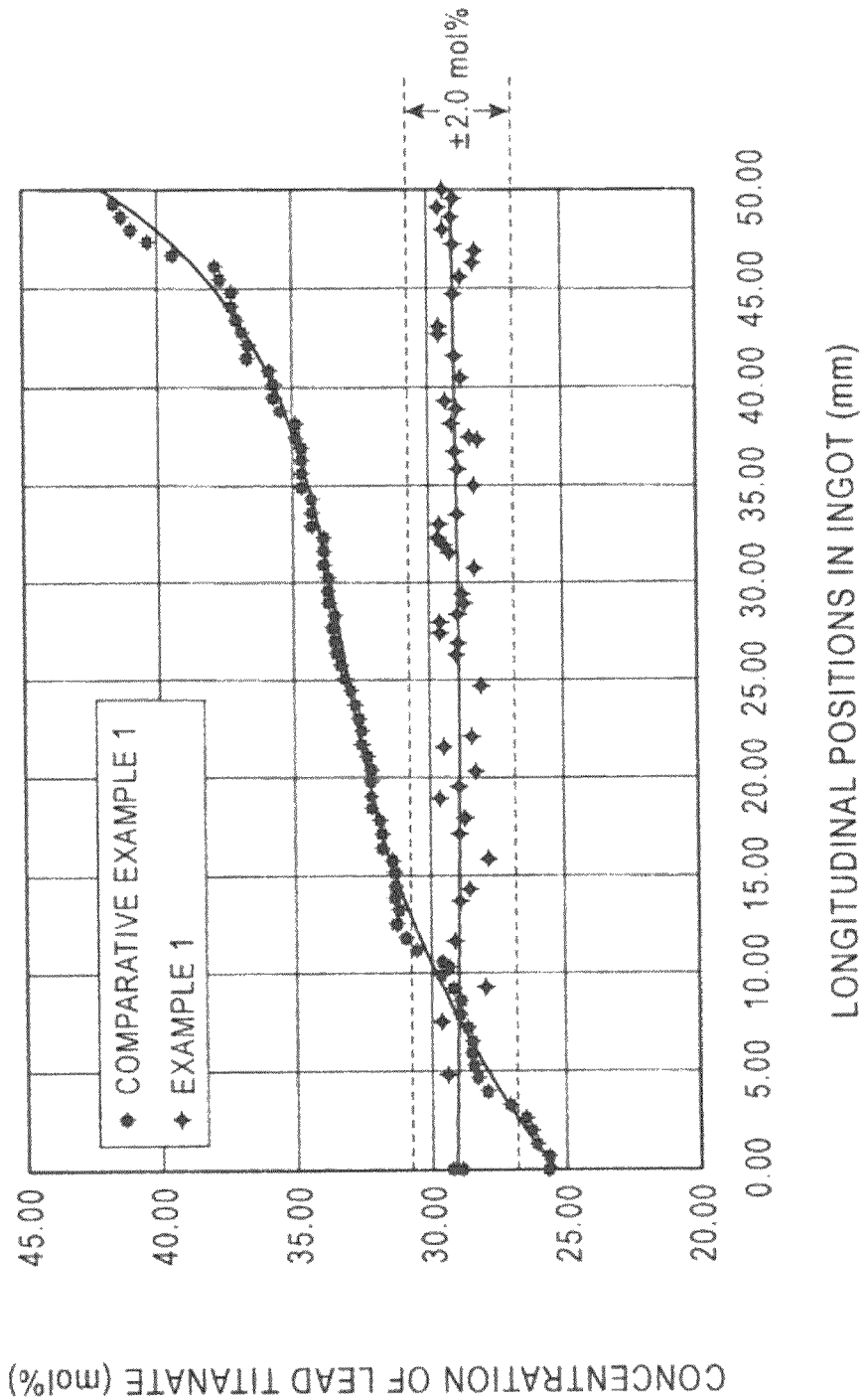
FIG. 4 is a graph showing the relationship between the length (mm) of a piezoelectric single crystal ingot prepared in each of Example 1 and Comparative Example 1 in the growth direction thereof and the concentration (mole percent) of lead titanate.

Each obtained sample was used to make a graph showing the relationship between the length (mm) of the complete solid solution type piezoelectric single crystal ingot 1 in the growth direction thereof and the concentration (mole percent) of lead titanate. FIG. 4 shows the graph.

The sample was evaluated for the magnitude of the variation of the compositional fraction of lead titanate on the basis of results obtained from the graph.

The samples each have an ingot straight trunk portion used to manufacture a device. As is clear from FIG. 4, the variation of the compositional fraction (mole percent) of lead titanate in the ingot straight trunk portion of the sample of Example 1 is less than that of Comparative Example 1 and the sample of Example 1 has a uniform composition over a length (mm) in the growth direction.

The following can be provided: a complete solid solution type piezoelectric single crystal ingot in which the compositional fraction of lead titanate is inhibited from varying in the growth direction of a single crystal, a process for producing the complete solid solution type piezoelectric single crystal ingot, and a piezoelectric single crystal device which can be manufactured from the complete solid solution type piezoelectric single crystal ingot at low cost and which has uniform piezoelectric properties.

What is claimed is:

1. A piezoelectric single crystal ingot produced by the Bridgman method comprising at least a relaxor having a composition of Pb(Mg, Nb)$O_3$; and lead titanate having a composition of PbTi$O_3$, wherein the piezoelectric single crystal ingot has a compositional fraction of the lead titanate which does not vary monotonically in a growth direction of a single crystal and a variation of the compositional fraction which is within the range of ±2.0 mole percent over a length of 30 mm or more.

2. The piezoelectric single crystal ingot according to claim 1, which is a complete solid solution type piezoelectric single crystal ingot.

3. The piezoelectric single crystal ingot according to claim 1, comprising a complex perovskite structure.

4. The piezoelectric single crystal ingot according to claim 1, further comprising 0.5 mass ppm to 5 mass percent of at least one selected from the group consisting of Cr, Mn, Fe, Co, Al, Li, Ca, Sr, Ba, and Zr in total on the basis that 1 mol of Pb is 100 mass percent.

5. The piezoelectric single crystal ingot according to claim 4, wherein the piezoelectric single crystal ingot contains 0.5 mass ppm to 5 mass percent of at least one selected from the group consisting of Cr, Mn, Fe, and Co in total on, the basis that 1 mol of Pb is 100 mass percent.

6. The piezoelectric single crystal ingot according to claim 4, wherein the piezoelectric single crystal ingot contains 0.5 mass ppm to 5 mass percent of at least one selected from the group consisting of Ca, Sr, and Ba in total on the basis that 1 mol of Pb is 100 mass percent.

7. The piezoelectric single crystal ingot according to claim 4, wherein the piezoelectric single crystal ingot contains 0.5 mass ppm to 5 mass percent of at least one of Al and Li in total on the basis that 1 mol of Pb is 100 mass percent.

8. The piezoelectric single crystal ingot according to claim 1, wherein the piezoelectric single crystal ingot contains at least lead magnesium niobate having a composition of Pb(Mg$_{1/3}$Nb$_{2/3}$)$O_3$, and lead titanate having the composition of PbTi$O_3$.

9. A piezoelectric single crystal device produced from the piezoelectric single crystal ingot according to claim 1.

10. The piezoelectric single crystal ingot according to claim 1, produced by a method for producing a piezoelectric single crystal ingot containing at least a relaxor having a composition of Pb(Mg, Nb)$O_3$ and lead titanate having a composition of PbTi$O_3$, by the Bridgman method comprising:
continuously feeding at least a source of the relaxor to a growth crucible such that a compositional fraction of lead titanate does not vary monotonically in a growth direction of a single crystal and variation of the compositional fraction thereof is within a range of ±2.0 mole percent over a length of 30 mm or more.

11. The piezoelectric single crystal ingot according to claim 10, further comprising:
supplying a feeding source such that pellets obtained by sintering at least the relaxor source are quantitatively fed to the growth crucible at predetermined time intervals.

12. The piezoelectric single crystal ingot according to claim 4, produced by a method for producing a piezoelectric single crystal ingot containing at least a relaxor having a composition of Pb(Mg, Nb)$O_3$ and lead titanate having a composition of PbTi$O_3$, by the Bridgman method comprising:
continuously feeding at least a source of the relaxor to a growth crucible such that a compositional fraction of lead titanate does not vary monotonically in a growth direction of a single crystal and variation of the compositional fraction thereof is within a range of ±2.0 mole percent over a length of 30 mm, or more.

13. The piezoelectric single crystal ingot according to claim 5, produced by a method for producing a piezoelectric single crystal ingot containing at least a relaxor having a composition of Pb(Mg, Nb)$O_3$ and lead titanate having a composition of PbTi$O_3$, by the Bridgman method comprising:
continuously feeding at least a source of the relaxor to a growth crucible such that a compositional fraction of lead titanate does not vary monotonically in a growth direction of a single crystal and variation of the compositional fraction thereof is within a range of ±2.0 mole percent over a length of 30 mm or more.

14. The piezoelectric single crystal ingot according to claim 6, produced by a method for producing a piezoelectric single crystal ingot containing at least a relaxor having a composition of Pb(Mg, Nb)$O_3$ and lead titanate having a composition of PbTi$O_3$, by the Bridgman method comprising:
continuously feeding at least a source of the relaxor to a growth crucible such that a compositional fraction of lead titanate does not vary monotonically in a growth direction of a single crystal and variation of the compositional fraction thereof is within a range of ±2.0 mole percent over a length of 30 mm or more.

15. The piezoelectric single crystal ingot according to claim 7, produced by a method for producing a piezoelectric single crystal ingot containing at least a relaxor having a composition of Pb(Mg, Nb)$O_3$ and lead titanate having a composition of PbTi$O_3$, by the Bridgman method comprising:
continuously feeding at least a source of the relaxor to a growth crucible such that a compositional fraction of lead titanate does not vary monotonically in a growth direction of a single crystal and variation of the compositional fraction thereof is within a range of ±2.0 mole percent over a length of 30 mm or more.

16. The piezoelectric single crystal ingot according to claim 8, produced by a method for producing a piezoelectric single crystal ingot containing at least a relaxor having a composition of Pb(Mg, Nb)$O_3$ and lead titanate having a composition of PbTi$O_3$, by the Bridgman method comprising:
continuously feeding at least a source of the relaxor to a growth crucible such that a compositional fraction of lead titanate does not vary monotonically in a growth direction of a single crystal and variation of the compositional fraction thereof is within a range of ±2.0 mole percent over a length of 30 mm or more.

* * * * *